United States Patent [19]

Nevo

[11] Patent Number: 5,606,480

[45] Date of Patent: Feb. 25, 1997

[54] DETECTOR FOR MONITORING THE INTEGRITY OF A GROUND CONNECTION TO AN ELECTRICAL APPLIANCE

[75] Inventor: Haim Nevo, Kiryat Bialik, Israel

[73] Assignee: "Nevo" Electricity and Electronics Industries (1994) Ltd., Kiryat Bialik, Israel

[21] Appl. No.: 437,194

[22] Filed: May 8, 1995

[30] Foreign Application Priority Data

May 10, 1994 [IL] Israel ......................................... 109607

[51] Int. Cl.[6] ........................................................ H02H 3/16
[52] U.S. Cl. ............................. 361/46; 361/45; 361/86
[58] Field of Search .............................. 361/42, 46, 44, 361/45, 43, 47–50, 86, 88; 324/510

[56] References Cited

U.S. PATENT DOCUMENTS

| | | | |
|---|---|---|---|
| 3,863,238 | 1/1975 | Rowell | 340/649 |
| 4,707,759 | 11/1987 | Bodkin | 361/48 |
| 4,709,164 | 11/1987 | Giesl | 307/326 |
| 4,933,801 | 6/1990 | Glennon et al. | 361/45 |
| 5,051,732 | 9/1991 | Robitaille | 340/650 |
| 5,485,340 | 1/1996 | Avitan | 361/45 |

FOREIGN PATENT DOCUMENTS

| | | |
|---|---|---|
| 2611674 | 9/1977 | Germany . |
| 2167618 | 5/1986 | United Kingdom . |

*Primary Examiner*—Jeffrey A. Gaffin
*Assistant Examiner*—Michael J. Sherry
*Attorney, Agent, or Firm*—Sprung Horn Kramer & Woods

[57] ABSTRACT

A detector for monitoring the integrity of a ground connection to an electrical appliance having live and neutral terminals for feeding current to the appliance from respective live and neutral feeders of an electrical supply having a ground point for connecting to the ground terminal of the appliance. The detector comprises a differential comparator circuit for comparing a voltage at the neutral connection with a voltage at the ground terminal of the appliance and producing a fault signal if a difference therebetween exceeds a predetermined threshold. A normally closed switching device is connected in at least one of the live and neutral connections so as to be opened by a relay operatively coupled to the detector and responsive to the fault signal produced thereby.

11 Claims, 4 Drawing Sheets

DETECTOR FOR MONITORING THE INTEGRITY OF A GROUND CONNECTION TO AN ELECTRICAL APPLIANCE

FIELD OF THE INVENTION

This invention is related to electrical protection systems associated with earth fault loops.

BACKGROUND OF THE INVENTION

Throughout the last 15 to 20 years, earth leakage circuit breakers (ELCBs) have been used with increasing frequency to protect against earth leakage faults. The principle of the ELCB, as is well known, is that in the event of an earth fault, some of the current which normally flows through the live feeder and returns through the neutral, leaks to earth. Consequently, there exists an imbalance between the respective live (or phase) and neutral currents. The imbalance is detected and, if it exceeds a predetermined threshold level, a relay is energized which interrupts the electrical supply voltage fed to the live and neutral feeders.

The value of ELCBs is particularly manifest when protecting against earth leakage in an appliance having an electrically conductive housing which is connected to ground. In such case, if a fault occurs in the appliance whereby the casing becomes live, then the earth leakage current flows to ground and immediately operates the ELCB. However, if the ground connection is faulty such that there is no leakage path for current to flow in the event that the casing becomes live, then the ELCB will not become energized until somebody touches the electrically conductive housing and thereby provides a leakage path to ground. In such case, the leakage current passes through the person giving rise to the required imbalance between the live and neutral feeder currents which causes the ELCB to operate. Under these circumstances, whilst the ELCB will still operate, there is an inevitable earth leakage through the person who touches the appliance.

Thus, the ELCB must be so adjusted that the leakage current which occurs in such circumstances is not fatal. However, what constitutes a "fatal" leakage current varies from one person to another. Moreover, the leakage current which will actually flow through a person consequent to the casing of an electrical appliance becoming "live" is a function of the person's body resistance. People whose skin is apt to be moist (mothers and children, for example) have a much lower skin resistance than building site personnel, for example, whose skin tends to be dry and callose. A leakage current which might give the latter a slight shock might nevertheless prove fatal for the former. Furthermore, the magnitude of leakage current which could be fatal for a youngster is so low that to adjust the ELCB so as to be effective against such a small leakage current would, in practice, result in false alarms and unnecessary tripping of the ELCB.

There is, in fact, no perfect solution to this problem. The best that can be done is to adjust the ELCB to operate at an "average" leakage current, typically in the order of 30 mA, mindful of the fact that such a current can indeed be fatal for a segment of the population. When it is further borne in mind that, if the ground connection of an appliance is absent or faulty, then a leakage current will generally find a return path to ground through a person who inadvertently touches an appliance's metal casing, it is apparent that, in some cases at least, ELCBs give an apparent, but not altogether justified, impression of safety.

SUMMARY OF THE INVENTION

It is an object of the invention to provide a protection device which either replaces or can be used in conjunction with an ELCB and which eliminates or significantly reduces the drawbacks described above.

According to a broad aspect of the invention there is provided a detector for monitoring the integrity of a ground connection to an electrical appliance having live and neutral terminals for feeding current to the appliance from respective live and neutral feeders of an electrical supply having a ground point for connecting to a ground terminal of the appliance, said detector comprising: a differential comparator circuit for comparing a voltage at the neutral connection with a voltage at the ground terminal of the appliance and producing a fault signal if a difference between said voltages exceeds a predetermined threshold.

Such a detector may be used merely to give an indication that the ground connection to an appliance is faulty. Preferably, the detector further includes an interruption means responsive to the fault signal for opening a switch contact in at least one of the live and neutral feeders.

BRIEF DESCRIPTION OF THE DRAWINGS

In order to understand the invention and to see how it may be carried out in practice, some preferred embodiments will now be described, by way of non-limiting example only, with reference to the accompanying drawings, in which.

DETAILED DESCRIPTION OF PREFERRED EMBODIMENTS

Figure 1A:
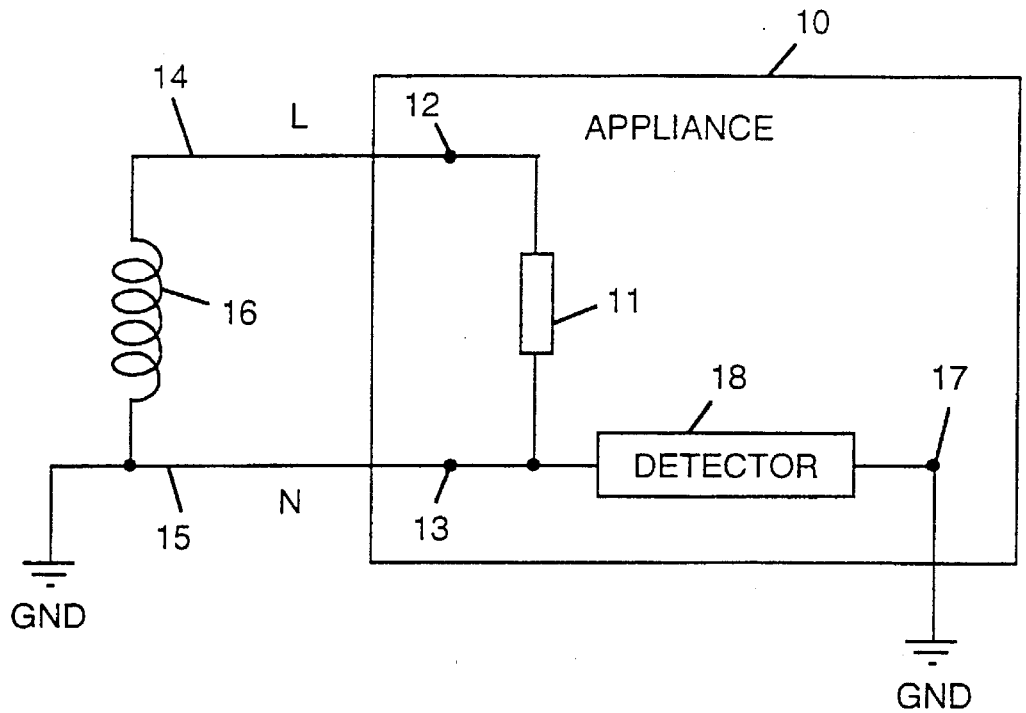
FIGS. 1a, 1b and 1c show schematic representations of an appliance incorporating a detector according to the invention.

FIG. 1a shows an appliance 10 representing an electrical load 11 which is connected to live and neutral terminals 12 and 13, respectively. Current is fed to the appliance 10 via respective live and neutral feeders 14 and 15 of an electrical supply represented schematically by a transformer winding 16. In practice, the transformer winding 16 is a single phase of a 3-phase supply having a star connected transformer secondary winding whose star point, constituting the neutral feeder 15, is connected to ground, GND.

Associated with the appliance 10 is a ground terminal 17 which is itself connected to GND. It is to be understood that the ground terminal denoted as GND is, in fact, provided by the electrical supply company and is normally anchored to a local busbar in the customer's distribution board (not shown). Connected between the neutral terminal 13 and the ground terminal 17 of the appliance 10 is a detector 18 for monitoring the integrity of the ground connection between the ground terminal 17 and GND. For the sake of completeness, it should be noted that the potentials associated with the ground terminal 17 and the remote ground connection of the electrical supply at the site of the distribution transformer, also denoted by GND, are nominally the same. However, they are not actually physically connected to the same point and it is therefore legitimate for there to be a slight discrepancy between the actual potentials associated with the remote and local ground connections. The maximum permitted discrepancy is fixed by the electrical supply company and is typically less than 12 V. The detector 18 detects whether the difference between the voltages at the neutral terminal 13 and the ground terminal 17 exceeds the maximum voltage fluctuation permitted by the electrical supply company and, if so, produces a fault signal indicative of a faulty ground connection to the appliance 10.

Figure 1B:
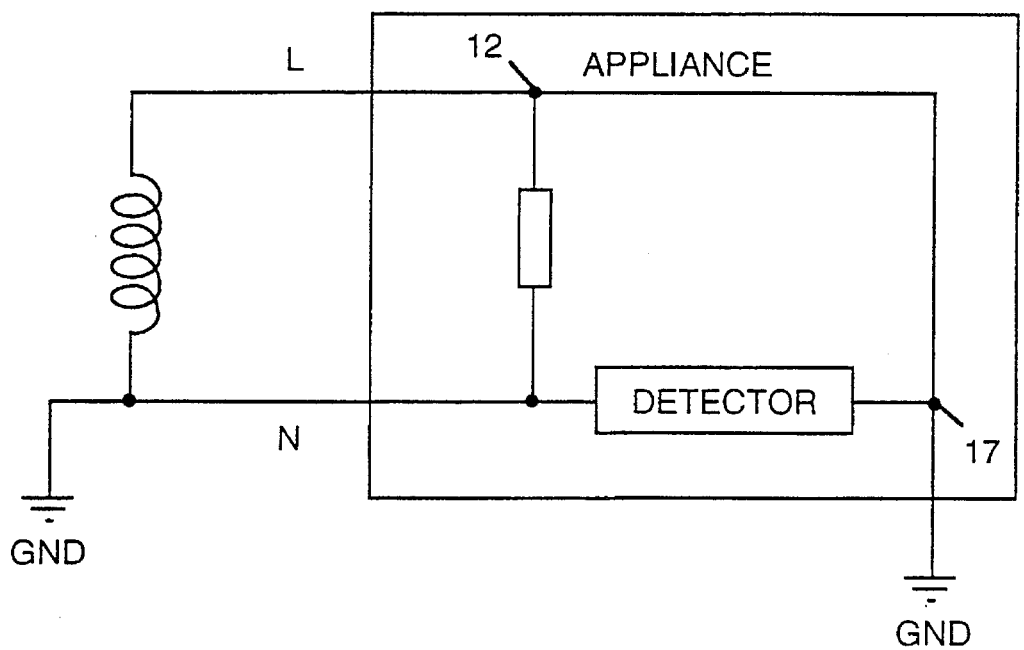

FIG. 1b shows schematically a fault condition wherein the live terminal 12 becomes connected to the ground terminal 17. Providing that the ground terminal 17 is connected to GND, there will exist a leakage current through to GND such that there will exist a disparity between the live feeder current and the neutral feeder current of sufficient magnitude to cause operation of a conventional ELCB (shown in FIG. 4).

Figure 1C:
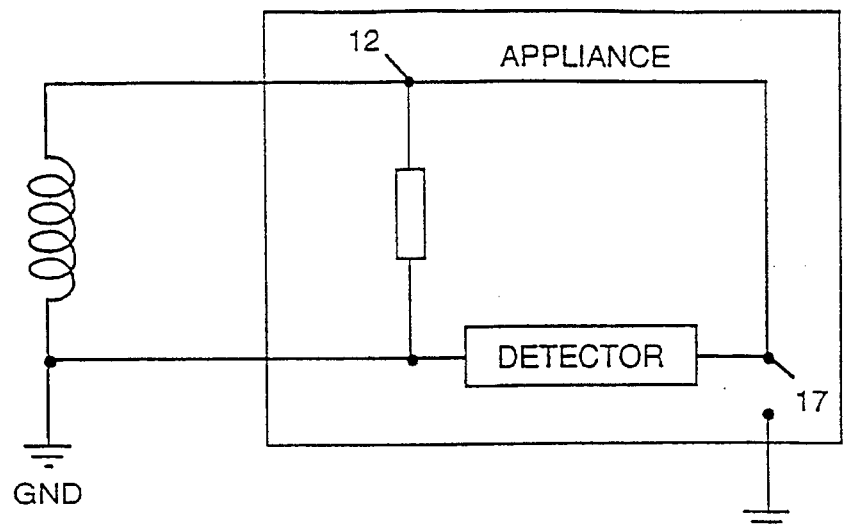

FIG. 1c shows yet another fault condition causing an effective short circuit between the live terminal 12 and the ground terminal 17 but wherein, owing to a faulty or absent ground connection, the ground terminal 17 is not connected to GND. Alternatively, owing to corrosion, for example, of the direct ground connection from the customer's distribution board to the ground terminal 17, the path between the ground terminal 17 and GND may present an increased resistance such that the ground terminal 17 is at a potential somewhat higher than GND. This situation is dangerous because a person who touches the appliance and makes connection with the live terminal 12 thereof, offers an alternative route for the leakage current to flow. An increase in the impedance of the direct ground connection to GND causes an increase in the leakage current which branches through the person. As explained above, this leakage current can, in some cases, prove fatal.

Figure 2:
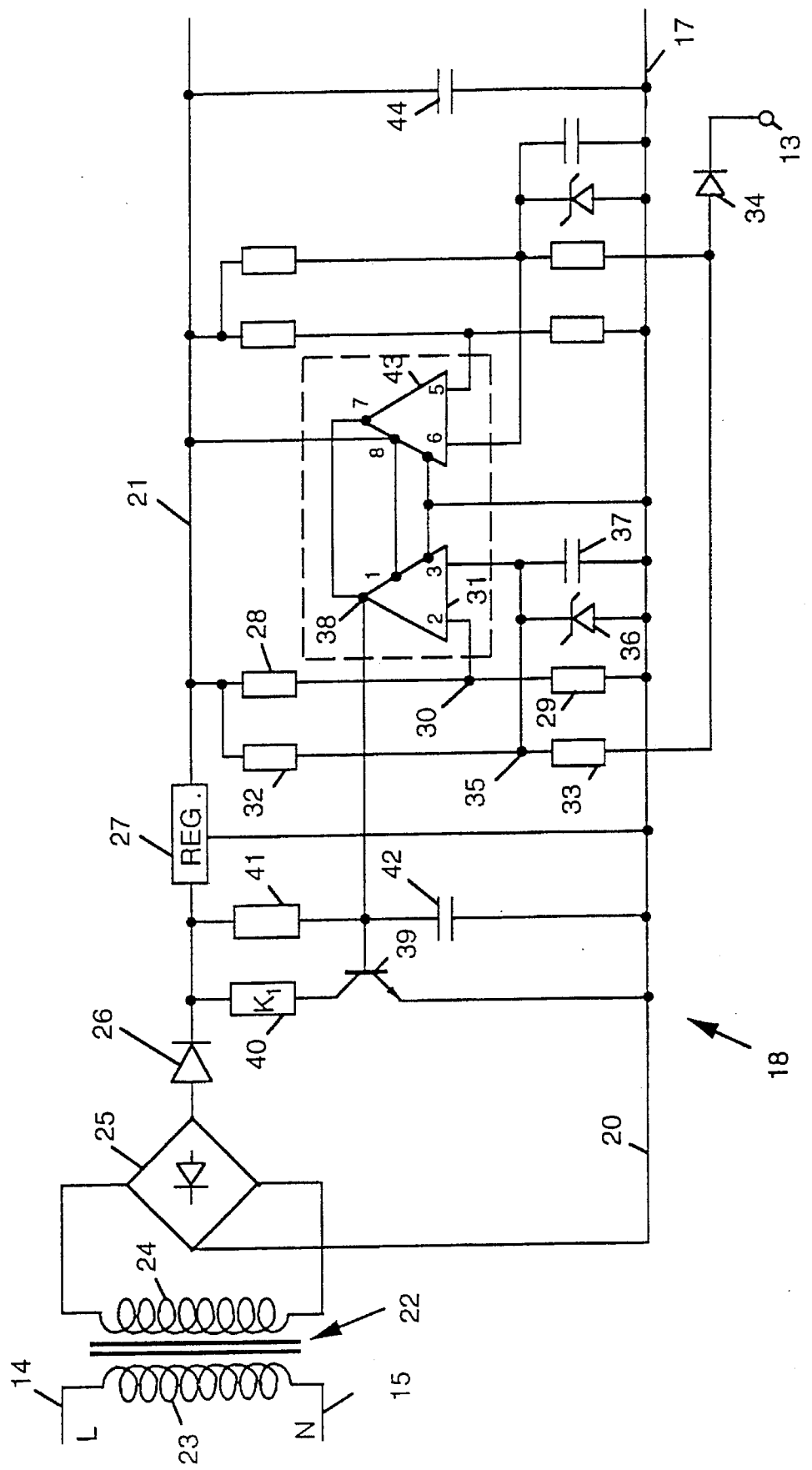
FIG. 2 is a circuit diagram showing schematically the detector according to the invention.

Referring now to FIG. 2 there is shown a circuit diagram of the detector 18 comprising a low voltage rail 20 connected to the ground terminal 17 of the appliance 10 and a high voltage rail 21 across which there exists a regulated 6 V d.c. voltage. The regulated d.c. voltage is derived, in conventional manner, via a step down transformer 22 whose primary winding 23 is connected across the live and neutral feeders 14 and 15 and whose secondary winding 24 is connected to a standard bridge rectifier 25 connected at its negative output to the low voltage rail 20 and connected at its positive output, via a rectifier diode 26, to a conventional 6 V integrated circuit regulator 27.

A first voltage divider comprising resistors 28 and 29 is connected across the voltage rails 20 and 21 and a common junction 30 thereof is connected to the inverting input of a comparator 31 so as to provide a reference voltage signal which is offset from the ground potential by a fixed amount. A second voltage divider comprising resistors 32 and 33 is connected between the high voltage rail 21 and the neutral terminal 13 of the appliance via a rectifier diode 34. A common junction 35 of the second voltage divider is connected to the non-inverting input of the comparator 31 and is also connected to the low voltage rail 20 via a 6 V zener diode 36 connected in parallel with a smoothing capacitor 37.

An output 38 of the comparator 31 is connected to the base of an NPN bipolar junction transistor 39 whose emitter is connected to the low voltage rail 20 and whose collector is connected, via a relay 40, to the unregulated high voltage rail. A resistor 41 is connected between the unregulated high voltage rail and the base of the bipolar junction transistor 39 which is connected via a capacitor 42 to the low voltage rail 20. In practice a rectifier diode (not shown) is connected across the relay coil 40 in order to shunt any high back e.m.f. generated by the coil 40 and thus avoid damage to the bipolar junction transistor 39.

In order to increase the security of the detector 18, a second comparator 43 is provided whose output is commonly connected to the output 38 of the first comparator 31 and whose inverting and non-inverting inputs are connected to GND and to the neutral terminal 13 of the appliance via respective first and second voltage dividers and peripheral components which are shown unmarked in the Figure since they are, in all respects, identical to the circuitry described above relating to the first comparator 31. The first and second comparators 31 and 43 are constituted by a dual comparator integrated circuit such as National Semiconductors LM193 series.

The rectifier diode 34 prevents the negative half-cycle of the a.c. supply voltage being compared with the ground voltage on the low voltage rail 20 so that the respective comparators 31 and 43 are effective only for the positive half-cycle of the a.c. supply. Likewise, any a.c. ripple associated with the ground voltage is smoothed by means of a smoothing capacitor 44 connected between GND and the high voltage rail 21, whilst the rectifier diode 26 has been shown to provide even greater stability.

The operation of the detector 18 is as follows. Normally, the output voltage of the comparator 31 is low so that the base voltage of the bipolar junction transistor 39 is low and the bipolar junction transistor 39 is cutoff. When a difference between the voltage levels appearing at the inverting and non-inverting inputs of either of the comparators 31 and 43 exceeds a predetermined threshold, which is determined by the values of the circuit components, then the output 38 of the comparators fed to the base of the bipolar junction transistor 39 becomes high and the bipolar junction transistor 39 is switched on and the relay 40 is energized. The relay 40 may be connected to produce an alarm indicative of a faulty ground connection, or may be connected to an interruption device such as an ELCB or contactor for automatically disconnecting the electricity supply from the appliance 10, as is described in greater detail below with reference to FIGS. 3 and 4 of the drawings.

In a particular embodiment of the detector 18 reduced to practice, the values of the resistors 28 and 29 in the first voltage divider are both 240 KΩ, whilst the values of the resistor 32 is 5.5 KΩ and that of the resistor 33 is 3.3 KΩ. The values of the capacitors 37, 42 and 44 are, respectively, 22 μF, 100 μF and 470 μF. The value of the resistor 41 is 1 KΩ.

The detector 18 described above with reference to FIG. 2 of the drawings is effective in the circuit configuration shown in FIG. 1b for indicating that the ground potential and that of the neutral terminal 13 do not differ by more than a permitted threshold. However, in the event of a fault which effectively short-circuits the live terminal 12 with the ground terminal 17, as shown in FIG. 1c, the ground terminal 17 is still connected to GND via the live feeder 14 and the secondary winding 16 of the electrical supply. If the length of the live feeder 14 is not so great that the combined impedance of the secondary winding 16 and the live feeder 14 do not produce too large a voltage drop, then it may occur that the voltage at the ground terminal 17 and that of the remote ground terminal of the electrical supply, and tied to the neutral feeder 13, are within the permitted tolerance. In this case, the detector 18 will register a "healthy" condition even though, in fact, the ground terminal 17 is not directly tied to GND.

Figure 3:
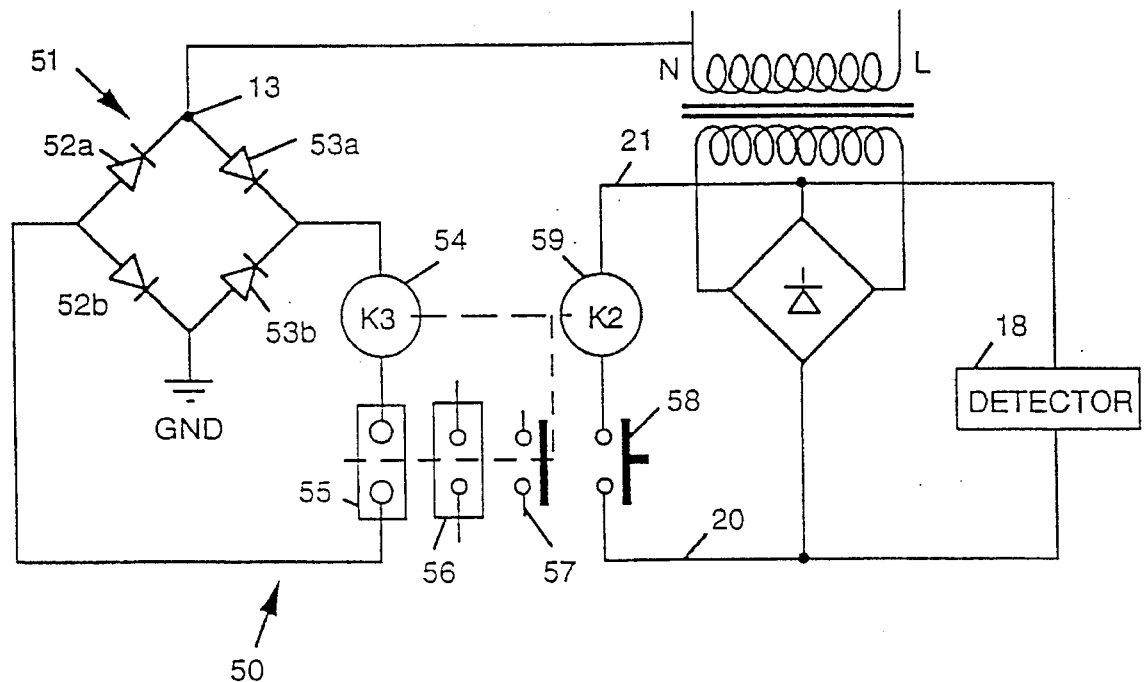
FIG. 3 shows schematically a detail of an auxiliary detector for use with the invention.

FIG. 3 shows an auxiliary detection circuit 50 for detecting a difference in voltage between the ground point GND of the electrical supply and the neutral terminal 13 of the appliance and comprising a bridge rectifier 51 having rectifier diodes 52a, 52b and 53a, 53b. The diodes 52a and 52b as well as the diodes 53a and 53b are connected back-to-back across the neutral terminal and GND. Owing to the back-to-back connection of the two pairs of diodes, each branch of the bridge rectifier 51 has a very high impedance, well in excess of 200 KΩ, this being the minimum impedance between the neutral and ground feeders permitted by the electricity supply company. The positive and negative outputs of the bridge rectifier 51 are connected to a relay coil 54 operatively connected in series with a latching normally closed switch contact 55 and being further operatively connected to a latching normally closed switch contact 56 and to a latching normally open switch contact 57 whose function is explained below with reference to FIG. 4 of the drawings.

When a voltage appears across the neutral terminal 13 and GND exceeding the reverse bias voltage of the rectifier diodes in the bridge rectifier 51, then bridge rectifier 51 conducts current between the neutral terminal 13 and GND so as to energize the relay coil 54 which causes the normally closed switch contact 56 to latch open and the normally open switch contact 57 to latch close. Energization of the relay coil 54 also causes the normally closed switch contact 55 connected in series with the relay coil 54 to latch open, thereby de-energizing the relay coil 54 and preventing it from overheating. However, since the normally closed switch contacts 55 and 56 as well as the normally open switch contact 57 are all latch contacts, they remain in their switched (i.e. energized) conditions even when current to the relay coil 54 is interrupted, until manually reset by a normally open pushbutton reset 58 connected in series with a relay coil 59 across the high and low voltage rails 21 and 20, described above with reference to FIG. 2 of the drawings.

Figure 4:
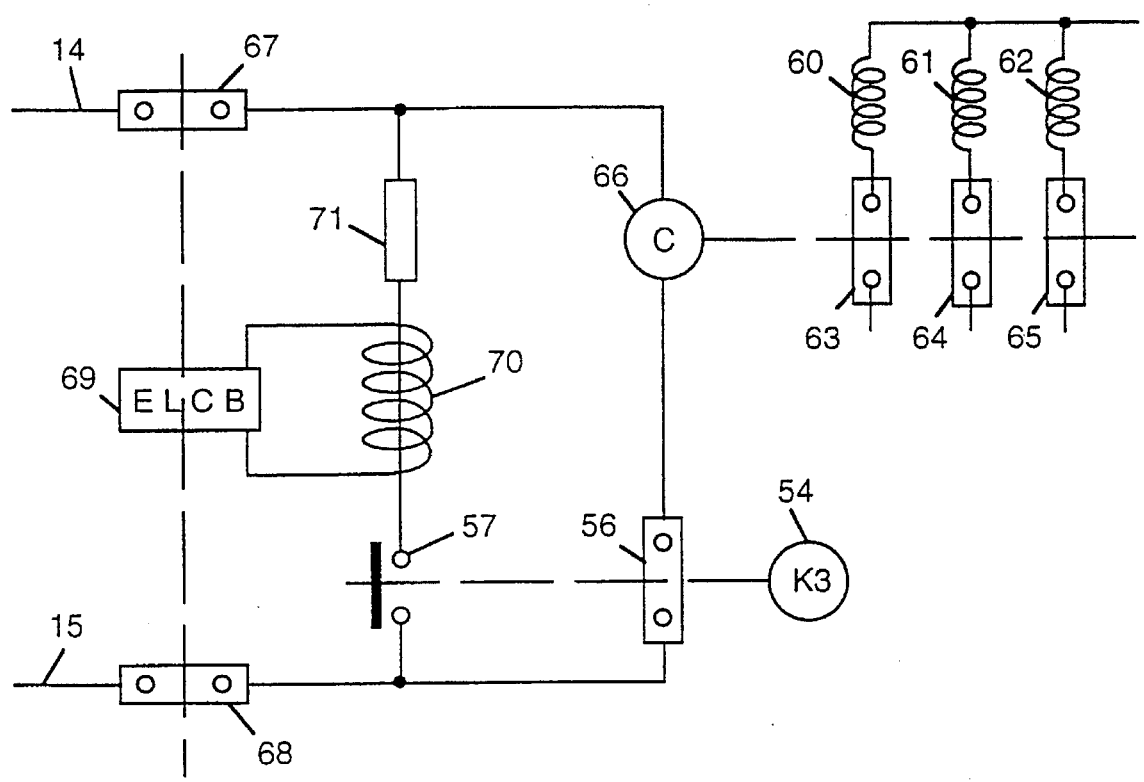
FIG. 4 shows schematically how the detector according to the invention may be used with a conventional ELCB or contactor.

Referring now to FIG. 4 of the drawings there are shown respective feeders 60, 61 and 62 of a 3-phase supply each connected in series with respective normally closed switch contacts 63, 64 and 65 which are adapted for simultaneous operation by a contactor 66 connected in series with the normally closed switch contact 56 described above with reference to FIG. 3 of the drawings. The contactor 66 together with the series-connected normally closed switch contact 56 are connected across the live and neutral feeders 14 and 15 via respective normally closed switch contacts 67 and 68 which are operatively coupled to an earth leakage circuit breaker (ELCB) 69 having a sensing coil 70. A resistor 71 is connected across the live and neutral feeders via the normally open switch contact 57, the resistor 71 being surrounded by the sensing coil 70 of the ELCB 69.

When, owing to an imbalance between the neutral and GND voltages, the relay 54 becomes momentarily energized, the normally closed switch contact latches open thereby connecting the contactor 66 across the live and neutral feeders 14 and 15, respectively. The contactor 66 thus energizes and the normally closed switch contacts 63, 64 and 65 open, thereby interrupting power to each of the 3-phase feeders 60, 61 and 62.

Operation of the relay coil 54 also causes the normally open switch contact 57 to latch close so as to connect the resistor 71 across the live and neutral feeders 14 and 15, respectively. The value of the resistor 71 is so chosen that the current which thus flows therethrough exceeds the earth fault current of the ELCB 69, typically 30 mA. Since this current flows through the sensing coil 70 of the ELCB 69, it is interpreted by the ELCB 69 as an earth fault current and the ELCB 69 operates so as to open the normally closed switch contacts 67 and 68 and thereby interrupt the single phase supply across the live and neutral feeders 14 and 15.

After diagnosing the cause of the fault and correcting it, power may now be restored and the reset pushbutton switch 58 (shown in FIG. 3) may be depressed so as to energize the relay coil 59. The relay coil 59 is operatively coupled to the latching switch contacts 55, 56 and 57 operated by the relay coil 54 so that, on energization of the relay coil 59, the two normally closed switch contacts 55 and 56 are restored to their closed state, whilst the normally open switch contact 57 is restored to its open state.

It will be appreciated that it may be desired to avoid use of both a contactor and an ELCB as shown in FIG. 4 and, if desired, one of these protection devices may be dispensed with. However, both are shown and described in order to demonstrate that the auxiliary detection circuit 50 is equally well suited for acting in conjunction with either of these devices.

It will further be appreciated that the auxiliary detection circuit 50, being connected between the neutral feeder 15 and GND, does not require connection of the appliance 10 since it is connected across the incoming neutral and ground connection points of the electrical supply. Consequently, the auxiliary detection circuit 50 protects against any impermissible voltage imbalance between the neutral and ground connections of the incoming electrical supply and causes the main contactor and/or the ELCB to trip consequent to such a condition. However, in the event that the ground terminal 17 of the appliance 10 is connected to GND, then both the main detector 18 and the auxiliary detection circuit 50 serve to monitor the integrity of the ground connection even in the absence of a ground fault. In the event of a ground fault, the auxiliary detection circuit 50 is operative even if the resulting impedance of the ground fault loop detected by the main detector 18 is too low to indicate a faulty ground connection.

There is thus provided in accordance with the invention a detector which monitors the integrity of the ground connection of an incoming electrical supply, so that in the event of a fault thereof, there will ensue a voltage imbalance between the ground and neutral connections which allows for interruption of the electrical supply. By such means, the integrity of the ground connection may be assured so that any earth leakage fault current will flow to GND, even if a metal casing of an electrical appliance becomes "live". This provides complete protection to a user of such an appliance since negligible earth leakage fault current flows through the user contrary to hitherto proposed ELCBs used either in ungrounded systems or in systems which are inadequately grounded.

I claim:

1. A detector for monitoring the integrity of a ground connection to an electrical appliance having live and neutral terminals for feeding current to the appliance from respective live and neutral feeders of an electrical supply having a ground point for connecting to a ground terminal of the appliance, said detector comprising:

differential comparator circuit means for comparing a fractional voltage at the ground terminal with a fractional voltage at the neutral terminal of the appliance, and for producing a fault signal if a difference between said fractional voltages exceeds a predetermined threshold;

wherein the differential comparator circuit means comprises:

low voltage d.c. power supply means having a high and a low voltage rail, said low voltage rail being coupled to the ground terminal of the appliance, first voltage divider means including a pair of resistors connected in series across the high and the low voltage rails and having a common junction coupled to a first input of a comparator, and second voltage divider means including a pair of resistors connected in series between the high voltage rail and the neutral terminals of the appliance and having a common junction coupled to a second input of the comparator.

2. The detector according to claim 1, wherein the differential comparator circuit further comprises:

an interruption means operatively coupled to an output of the comparator.

3. The detector according to claim 2, wherein the interruption means includes a transistor switch coupled to a normally closed switching device connected in at least one of the live and neutral terminals and being responsive to the fault signal for opening the switching device.

4. The detector according to claim 2, wherein the differential comparator circuit includes at least two comparators having respective outputs which are commonly connected to said interruption means.

5. The detector according to claim 1, wherein the comparator is an integrated circuit.

6. The detector according to claim 1, further including:

interruption means operatively coupled to a normally closed switching device connected in at least one of the live and the neutral terminals and being responsive to the fault signal for opening the switching device, and auxiliary detection circuit means for detecting a difference in voltage between the ground point of the electrical supply and the neutral terminal of the appliance, said auxiliary detection circuit means comprising:

very high impedance current detector means coupled between the neutral feeder and the ground point of the electrical supply for producing an imbalance signal if current flows in either direction between the neutral feeder and the ground point, and auxiliary interruption means operatively coupled to said normally closed switching device coupled and being responsive to the imbalance signal for opening the switching device.

7. The detector according to claim 6, wherein the current detector comprises a bridge rectifier having a pair of series-connected back-to-back rectifier diodes connected across the neutral feeder and the ground point of the electrical supply.

8. The detector according to claim 6, wherein:

the auxiliary interruption means is connected in series with a cut-throat switch so that on operation of the interruption means the cut-throat switch opens, thereby de-energizing the interruption means, and there is further provided a reset means for closing the cut-throat contact.

9. The detector according to claim 1, further including interruption means operatively coupled to a normally closed switching device connected in at least one of the live and the neutral connections and being responsive to the fault signal for opening the switching device.

10. The detector according to claim 9, wherein the switching device is a contactor.

11. The detector according to claim 9, wherein the switching device is an earth leakage circuit breaker.

* * * * *